US011916174B2

(12) United States Patent
Bower et al.

(10) Patent No.: US 11,916,174 B2
(45) Date of Patent: *Feb. 27, 2024

(54) DISPLAYS WITH INTERPOLATED PIXELS

(71) Applicant: X Display Company Technology Limited, Dublin (IE)

(72) Inventors: Christopher Andrew Bower, Raleigh, NC (US); Ronald S. Cok, Rochester, NY (US); Matthew Alexander Meitl, Durham, NC (US)

(73) Assignee: X Display Company Technology Limited, Dublin (IE)

(*) Notice: Subject to any disclaimer, the term of this patent is extended or adjusted under 35 U.S.C. 154(b) by 0 days.

This patent is subject to a terminal disclaimer.

(21) Appl. No.: 18/087,445

(22) Filed: Dec. 22, 2022

(65) Prior Publication Data

US 2023/0132981 A1 May 4, 2023

Related U.S. Application Data

(63) Continuation of application No. 17/103,213, filed on Nov. 24, 2020, now Pat. No. 11,588,075.

(51) Int. Cl.
| | |
|---|---|
| *H01L 33/48* | (2010.01) |
| *H01L 27/15* | (2006.01) |
| *G09G 3/20* | (2006.01) |
| *H01L 33/62* | (2010.01) |

(52) U.S. Cl.
CPC ......... *H01L 33/486* (2013.01); *G09G 3/2092* (2013.01); *H01L 27/156* (2013.01); *H01L 33/62* (2013.01); *G09G 2300/0465* (2013.01)

(58) Field of Classification Search
CPC ... H01L 33/486; H01L 27/156; G09G 3/2092; G09G 2300/0465
See application file for complete search history.

(56) References Cited

U.S. PATENT DOCUMENTS

| | | |
|---|---|---|
| 5,550,066 A | 8/1996 | Tang et al. |
| 7,622,367 B1 | 11/2009 | Nuzzo et al. |
| 8,506,867 B2 | 8/2013 | Menard |
| 8,722,458 B2 | 5/2014 | Rogers et al. |
| 9,520,537 B2 | 12/2016 | Bower et al. |
| 9,930,277 B2 | 3/2018 | Cok |
| 9,991,163 B2 | 6/2018 | Bower et al. |
| 10,347,168 B2 | 7/2019 | Meitl et al. |
| 11,037,912 B1 | 6/2021 | Meitl et al. |
| 11,164,934 B2 | 11/2021 | Bower et al. |

(Continued)

*Primary Examiner* — Kenneth B Lee, Jr.
(74) *Attorney, Agent, or Firm* — Choate, Hall & Stewart LLP; Michael D. Schmitt

(57) ABSTRACT

An interpolated flat-panel display comprises a display substrate, pixel controllers disposed in a controller array over the display substrate, and pixels disposed in a pixel array over the display substrate. Each pixel controller is connected to one or more control lines and is operable to output pixel information. Each pixel is operable to emit light in response to pixel information received from a pixel controller. The pixel array is larger than the controller array, each pixel is connected to at least one pixel controller, and at least some pixels are interpolated pixels connected to at least two pixel controllers and are operable to emit light in response to pixel information received from the at least two pixel controllers.

16 Claims, 8 Drawing Sheets

(56) References Cited

U.S. PATENT DOCUMENTS

| | | |
|---|---|---|
| 11,588,075 B2 * | 2/2023 | Bower ................... G09G 3/20 |
| 2016/0093600 A1 | 3/2016 | Bower et al. |
| 2017/0061867 A1 | 3/2017 | Cok et al. |
| 2020/0295120 A1 | 9/2020 | Bower et al. |
| 2021/0242180 A1 | 8/2021 | Meitl et al. |
| 2022/0165918 A1 | 5/2022 | Bower et al. |

* cited by examiner

DISPLAYS WITH INTERPOLATED PIXELS

TECHNICAL FIELD

The present disclosure relates to active-matrix display architectures with hardware pixel interpolation.

BACKGROUND

Flat-panel displays are widely used in conjunction with computing devices, in portable electronic devices, and for entertainment devices such as televisions. In recent years, flat-panel displays have increased in size and resolution, resulting in manufacturing challenges for such large flat-panel displays. High data rates are needed to communicate the large amounts of pixel data necessary to display large, high-resolution images. Such data rates can be difficult or expensive to achieve over large display substrates.

Displays are typically controlled with either a passive-matrix (PM) control scheme employing electronic control circuitry external to the pixel array or an active-matrix (AM) control scheme employing electronic control circuitry in the pixels on the display substrate and associated with each light-emitting element. Both OLED displays and LCDs using passive-matrix control and active-matrix control are available.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon or poly-crystalline silicon and is distributed over the entire flat-panel display substrate. The semiconductor layer is photolithographically processed to form electronic control elements, such as transistors and capacitors. Additional layers, for example patterned insulating dielectric layers and conductive metal layers are provided, often by evaporation or sputtering, and photolithographically patterned to form electrical interconnections, or wires. An example of such an AM OLED display device is disclosed in U.S. Pat. No. 5,550,066.

In some display implementations, small integrated circuits (ICs) with a separate IC substrate disposed on a display substrate control pixels in an AM display. The integrated circuits can be disposed on the display substrate using micro-transfer printing, for example as taught in U.S. Pat. No. 9,930,277. Some displays comprise micro-light-emitting diodes controlled by micro-pixel controllers to emit light from a display substrate. Because the display components are so small, the display has a small fill factor (aperture ratio) so that other structures or components can be provided on the display, for example as disclosed in U.S. Pat. No. 9,991,163.

There remains a need for active-matrix display systems that provide improved signal distribution of high bandwidth signals, reduced bandwidth requirements, and high-resolution images over relatively large display substrates.

SUMMARY

The present disclosure includes, among various embodiments, a flat-panel display comprising an interpolated flat-panel display comprising a display substrate, pixel controllers disposed in a controller array over the display substrate, and pixels disposed in a pixel array over the display substrate. Each pixel controller is connected to one or more control lines to receive pixel information from the one or more control lines and is operable to output the pixel information to one or more pixels. Each pixel is operable to emit light in response to pixel information received from a pixel controller. The pixel array is larger than the controller array, each pixel is connected to at least one pixel controller, and at least some pixels are interpolated pixels connected to at least two pixel controllers and are operable to emit light in response to pixel information received from the at least two pixel controllers.

In some embodiments, the pixel array is larger than the controller array in one dimension and at least some interpolated pixels are connected to adjacent pixel controllers in one dimension. In some embodiments, the pixel array is larger than the controller array in two dimensions and at least some of the interpolated pixels are connected to adjacent pixel controllers in a first dimension and at least some of the interpolated pixels are connected to adjacent pixel controllers in a second dimension different from the first dimension. In some embodiments, at least some of the interpolated pixels are connected to adjacent pixel controllers in the first dimension and are connected to adjacent pixel controllers in the second dimension. Pixels can be disposed at pixel locations and first and second pixels can be disposed at pixel locations on a diagonal of the pixel controller array, the first pixels can be connected to adjacent pixel controllers in a first row of pixel controllers and the second pixels can be connected to adjacent pixel controllers in a second row of pixel controllers adjacent to the first row.

According to some embodiments of the present disclosure, at least some pixels comprise a programmable memory, internally programmable wires, or externally programmable wires indicating the number of pixel information input connections to pixel controllers for receiving pixel information.

In some embodiments, each interpolated pixel comprises a calculation circuit operable to calculate a light-output value in response to pixel information, a light emitter, and a drive circuit operable to drive the light emitter in response to the calculated light-output value. The calculation circuit can calculate an average of the received pixel information. The calculation circuit can comprise or communicate with a pixel memory operable to store a light-output value.

In some embodiments, the interpolated pixels are connected to each of two pixel controllers with a pixel information input. The two pixel controllers can be adjacent in a dimension (e.g., an x or y dimension) over the display substrate. At least some of the pixels can be connected to one pixel controller with two pixel information inputs or with four pixel information inputs. At least some of the interpolated pixels can be connected to each of four pixel controllers with a pixel information input. The four pixel controllers can be adjacent over the display substrate. At least some of the interpolated pixels can be connected to each of two pixel controllers with two pixel information inputs.

According to some embodiments of the present disclosure, the interpolated pixels comprise only green light emitters that emit green light in response to pixel information received from the at least two pixel controllers. Each interpolated pixel comprises two green light emitters and each green light emitter is responsive to only one pixel controller.

According to some embodiments of the present disclosure, each pixel can comprise an inorganic light-emitting diode and the inorganic light-emitting diodes can have at least one of a length and a width no greater than 100 microns (e.g., no greater than 50 microns, no greater than 20 microns, or no greater than 10 microns) and, optionally, a thickness no greater than 20 microns.

In some embodiments, a method of operating a flat-panel display comprises providing an active-matrix display (e.g., an analog or digital active-matrix display) comprising an array of pixels and an array of pixel controllers. At least some of the pixels can be provided with respective pixel information signals from a respective more than one of the pixel controllers. The one or more light emitters in the at least some of the pixels can be automatically driven to emit light based on the respective pixel information signals.

In some embodiments, the one or more light emitters are driven to emit light based on a combination of respective pixel information signals. In some embodiments, the combination is an average. In some embodiments, the average is a weighted average (e.g., weighted based on a respective location of the respective more than one of the pixels controllers). In some embodiments, the combination is a minimum or a maximum of respective pixels information signals. In some embodiments, the respective more than one of the pixel controllers is at least four of the pixel controllers.

In some embodiments, a flat-panel active-matrix display comprises an array of pixel controllers and an array of substantially identical pixels. In some embodiments, different ones of the pixels in the array of pixels are electrically connected to different numbers of the pixel controllers.

In some embodiments, each of the pixels in the array of pixels comprises a programmable memory that is programmable to store a code that indicates the number of the pixel controller(s) to which the pixel is electrically connected by respective pixel information input(s). In some embodiments, each of the pixels in the array of pixels comprises one or more programmable wires that are programmable to store a code that indicates the number of the pixel controller(s) to which the pixel is electrically connected by respective pixel information input(s).

In some embodiments, some of the pixels, and less than all of the pixels, are electrically connected to at least two of the pixel controllers. In some embodiments, none of the pixels are electrically connected to more than two of the pixel controllers. In some embodiments, the some of the pixels comprise pixels electrically connected to exactly two of the pixels controllers and pixels electrically connected to exactly four of the pixel controllers. In some embodiments, the number of the pixels is larger than the number of the pixel controllers. In some embodiments, each of the pixels is constructed to be able to receive pixel information from a number of pixel information inputs equal to a maximum number of the pixel controllers to which any of the pixels is electrically connected.

Embodiments of the present disclosure provide active-matrix display control architectures and methods that provide display architectures with reduced pixel data rates and improved resolution over relatively large display substrates.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
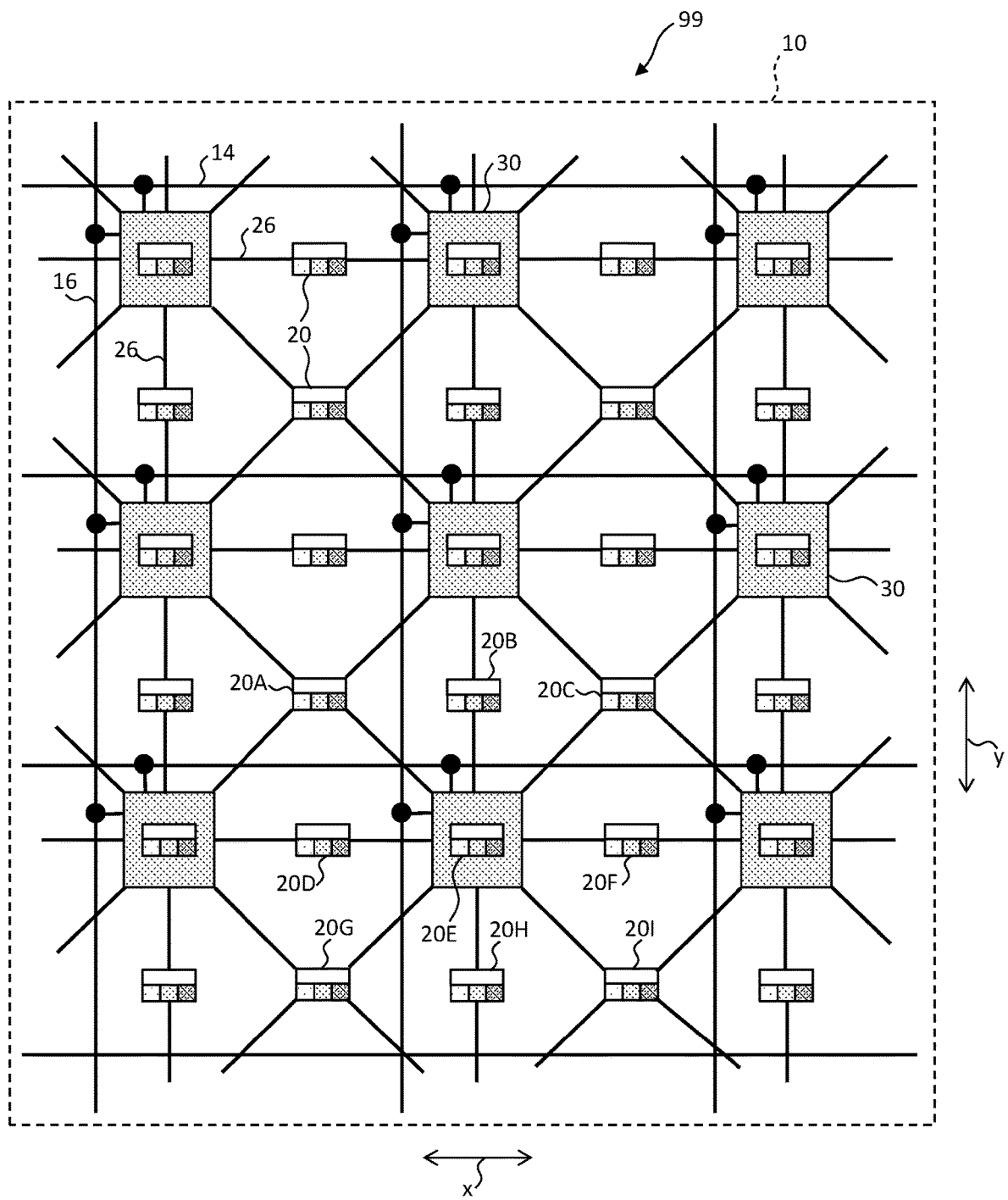
FIG. 1 is a schematic plan view of a display having interpolated two-input and four-input pixels according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide, inter alia, display control methods and architectures that enable reduced data rates with fewer external control lines and display controllers with less logic and fewer outputs. The pixels can comprise inorganic light-emitting diodes and the displays can be active- or passive-matrix displays or can be analog or digital displays.

Figure 4:
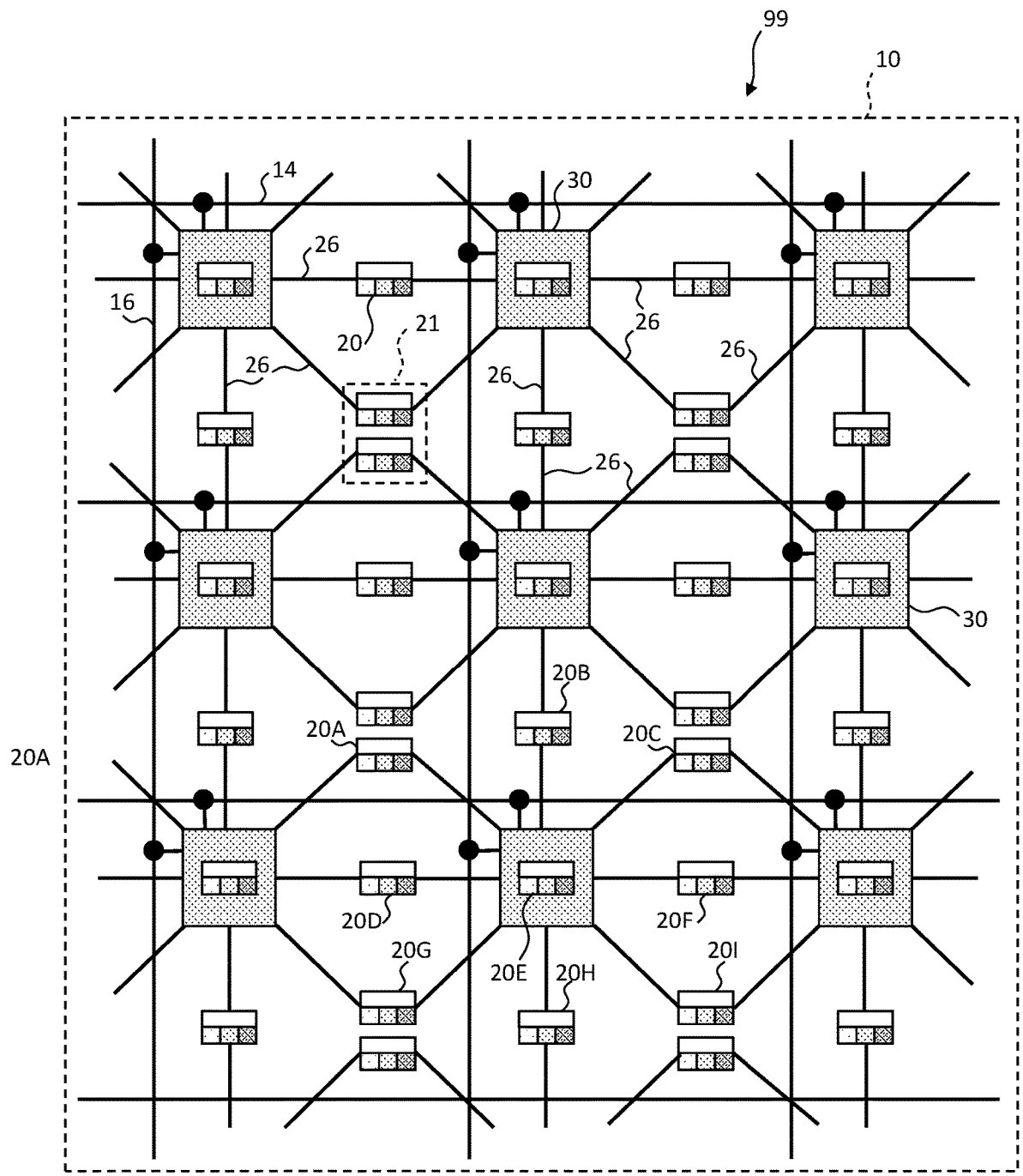
FIG. 4 is a schematic plan view of a display having interpolated two-input pixels according to illustrative embodiments of the present disclosure.

According to some embodiments of the present disclosure and as illustrated in FIGS. 1 and 4, an interpolated flat-panel display 99 comprises a display substrate 10 and pixel controllers 30 disposed in a controller array over display substrate 10. Each pixel controller 30 is connected to one or more control lines (e.g., row-select lines 14 or column-data lines 16, connections indicated with dots) to receive pixel information from the control lines and is operable to output pixel information, for example on pixel wires 26. Signals on the one or more control lines can be provided to pixel controllers 30 by a display controller (not shown in the Figures) and can be digital or analog active- or passive-matrix control signals. A pixel array of pixels 20 is disposed over display substrate 10. Each pixel 20 is connected to at least one pixel controller 30 and receives pixel information from the connected pixel controller(s) 30 through pixel information inputs 26 (also referred to herein as "inputs" or "pixel inputs") connected to the connected pixel controller(s) 30, e.g., with electrical connections. The pixel information received from the control lines can be the same pixel information that is output to pixels 20 on pixel wires 26. Each pixel 20 is operable to emit light in response to pixel information received from one or more pixel controllers 30 connected to the pixel 20 with pixel information inputs 26.

The pixel array is larger than the controller array so that more pixels 20 are disposed on display substrate 10 than pixel controllers 30 are disposed on display substrate 10. At least some pixels 20 are interpolated pixels 20 connected to at least two pixel controllers 30 and receive pixel information from the at least two pixel controllers 30. Pixels 20 are operable to combine the received pixel information from the at least two pixel controllers 30 and emit light in response to the combined pixel information. In some embodiments, interpolated pixels 20 receive pixel data from at least two pixel controllers 30, for example from two pixel controllers 30. In some embodiments, interpolated pixels 20 receive pixel data from four pixel controllers 30. Interpolated pixels 20 can comprise circuits to combine, for example average, the pixel information received from more than one pixel controller 30.

In some embodiments and as shown in FIG. 1, each pixel controller 30 is connected (e.g., electrically connected) with pixel wires 26 to nine pixels 20 (e.g., pixel 20A, pixel 20B, pixel 20C, pixel 20D, pixel 20E, pixel 20F, pixel 20G, pixel 20H, and pixel 20I, collectively pixels 20) in a three-by-three array. (Throughout the description, where one or more of pixel 20A, pixel 20B, pixel 20C, pixel 20D, pixel 20E, pixel 20F, pixel 20G, pixel 20H, and pixel 20I are referenced, it should be understood that the reference is to a pixel in that relative position to a pixel controller 30 and not necessarily a reference to a particular single pixel 20 within a pixel array. Thus, a reference to, for example, a pixel 20A, may be considered to be effectively a reference to a sub-array of pixels 20 within a larger pixel array.) Each pixel controller 30 receives pixel information from a display controller and sends the received pixel information to each of the nine pixels 20 to which it is connected by a pixel wire 26. Each pixel 20 on a side of each pixel controller 30 (e.g., pixel 20B and pixel 20H in the y direction and pixel 20D and pixel 20F in the x direction) is connected by a pixel wire 26 to two neighboring pixel controllers 30 so that pixels 20 on a side of a pixel controller 30 are interpolated pixels 20 that receive pixel information from two pixel controllers 30. Each pixel 20 on a diagonal of each pixel controller 30 (e.g., pixel 20A, pixel 20C, pixel 20G, and pixel 20I) is connected by a pixel wire 26 to four pixel controllers 30 so that pixels 20 on a diagonal of a pixel controller 30 are interpolated pixels 20 that receive pixel information from four pixel controllers 30. Thus, pixel 20B, pixel 20D, pixel 20F, and pixel 20H combine two sets of pixel information and pixel 20A, pixel 20C, pixel 20G, and pixel 20I combine four sets of pixel information. The combined pixel information is then output by light emitters 28 in each corresponding pixel 20. Pixel 20E, the center pixel 20 in the three-by-three array of pixels 20 connected by pixel wires 26 to each pixel controller 30 is connected only to (e.g., and disposed on or adjacent to) one pixel controller 30. Pixel controllers 30 on the edge of the controller array can be connected to fewer pixels 20, for example if there are no pixels 20 outside the boundary defined by the outermost perimeter of pixel controllers 30.

In FIG. 1, the three-by-three arrays of pixels 20 connected to each pixel controller 30 overlap on each side of pixel controllers 30. For example, a pixel 20B connected to a first pixel controller 30 corresponds to a pixel 20H for a second pixel controller 30 directly above the first pixel controller 30 (in the y direction). Likewise, a pixel 20D connected to a first pixel controller 30 corresponds to a pixel 20F for a second pixel controller 30 directly to the left of the first pixel controller 30 (in the x direction). A pixel 20A connected to a first pixel controller 30 corresponds to a pixel 20I for a second pixel controller 30 directly to the upper left of the first pixel controller 30, corresponds to a pixel 20G for a third pixel controller 30 directly above the first pixel controller 30 (in the y direction), and corresponds to a pixel 20C for a fourth pixel controller 30 directly to the left of the first pixel controller 30 (in the x direction).

As shown in FIG. 1, the number of pixels 20 in each of two orthogonal dimensions (e.g., the x direction and the y direction) can be twice that of the number of pixel controllers 30 so that there are four times as many pixels 20 as there are pixel controllers 30. Thus, embodiments of the present disclosure can interpolate a pixel array in hardware on the display substrate 10 without requiring any software upscaling of an image, for example upscaling in a display controller, row controller, or column controller. For example, in some embodiments, a 1080p resolution image could be upscaled to a 4K resolution image by combining information from pixel controllers 30 together at interpolated pixels 20 in a display 99, thereby reducing or eliminating the need for data processing at a display controller or other processing device electrically connected to the display controller.

In some embodiments of the present disclosure, a pixel 20E has only one pixel information input 26, a pixel 20B, a pixel 20D, a pixel 20F, and a pixel 20H each have two pixel information inputs 26, and a pixel 20A, a pixel 20C, a pixel 20G, and a pixel 20I each have four pixel information inputs 26 connected to the corresponding pixel controllers 30. A pixel information input 26 can be a pixel wire 26 connected to a pixel 20 from a pixel controller 30 or a pixel connection 26 between a pixel controller 30 and a pixel 20 through which pixel information (e.g., signals) can be communicated from pixel controller 30 to pixel 20 and received by an electrical circuit in pixel 20. Each of the different kinds of pixels 20 can be constructed with the desired number of pixel information inputs 26 and then assembled, for example by micro-transfer printing, onto display substrate 10. Each of the different kinds of pixels 20 can be constructed on a common source wafer or on different source wafers. For example, each different kind of pixel 20 can have different circuit layouts, different electrical connection points, or other different features such that overall display 99 assembly efficiency is improved by formation on different source wafers. Micro-transfer printed components (e.g., pixels 20 or pixel controllers 30) can comprise broken (e.g., fractured) or separated tethers as a consequence of micro-transfer printing.

Thus, according to some embodiments, pixels 20 on the diagonal between pixel controllers 30 have four pixel connections 26, pixels 20 on the sides of pixel controllers 30 (in the x and y directions) have two pixel connections 26, and pixels 20 in the center of the three by three array of pixels 20 connected with pixel connections 26 to each pixel controller 30 has one pixel connection 26. Pixels 20 with different numbers of pixel connections 26 can be made as different pixels 20 on a common native source substrate (e.g., with different mask designs) and separately assembled (e.g., micro-transfer printed) on display substrate 10 or a pixel substrate 22. According to some embodiments, the different pixels 20 are constructed on different wafers and separately assembled (e.g., micro-transfer printed) on display substrate 10 or a pixel substrate 22.

Figure 2:
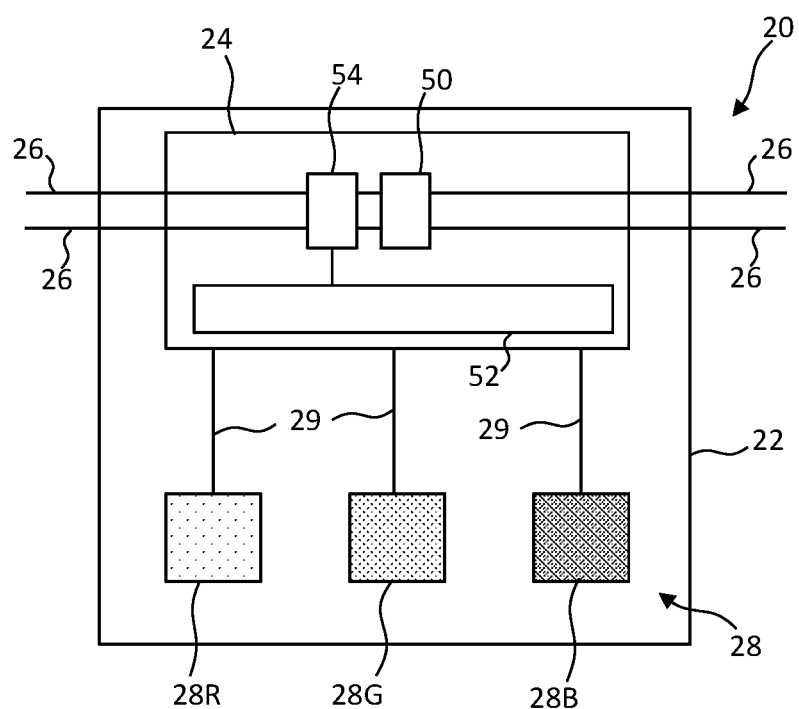
FIG. 2 is a schematic circuit diagram of a four-input pixel according to illustrative embodiments of the present disclosure.
Figure 5:
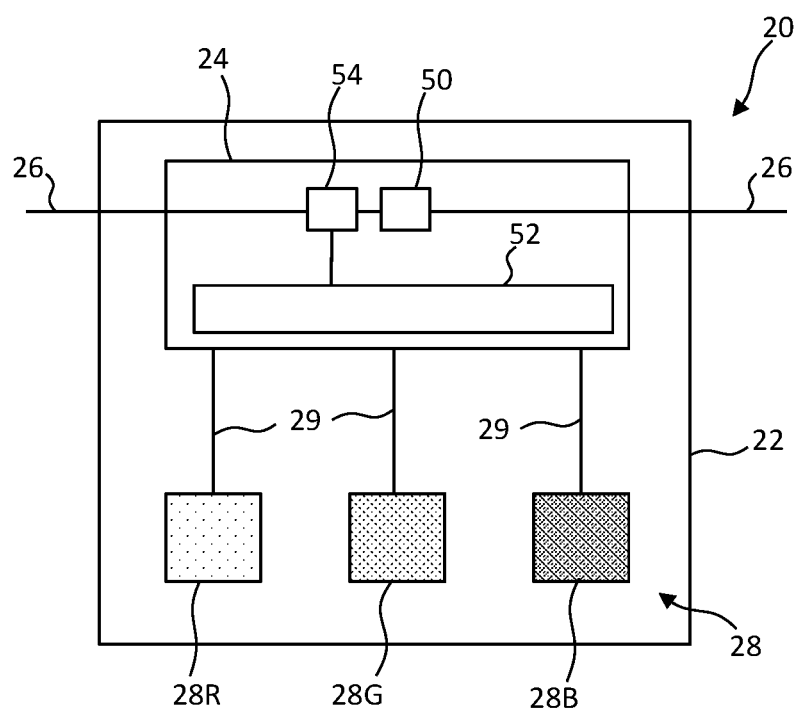
FIG. 5 is a schematic circuit diagram of a two-input pixel according to illustrative embodiments of the present disclosure.

As shown in FIG. 2, a four-input pixel 20 can comprise a pixel circuit 24, and one or more light emitters 28, disposed on or in a pixel substrate 22 and is connected to four pixel wires 26 comprising four pixel information inputs 26. (The box labelled pixel circuit 24 in FIG. 2 (and in other Figures) is representative and not intended to imply any spatial extent or structural feature necessarily exists, for example beyond pixel memory 54, calculation circuit 50, and/or drive circuit 52 where present.) Similarly, a two-input pixel 20 can comprise a pixel circuit 24, and one or more light emitters 28, disposed on or in a pixel substrate 22 and is connected to two pixel wires 26 comprising two pixel information inputs 26 (e.g., as shown in FIG. 5). A one-input pixel 20 can comprise a pixel circuit 24 disposed on or in a pixel substrate 22 and is connected to one pixel wire 26 (not separately shown in the Figures). Pixel circuit 24 can be native to pixel substrate 22 or can be disposed on pixel substrate 22, for example by micro-transfer printing, or can be native to display substrate 10. Pixel substrate 22 can be a semiconductor substrate or a dielectric substrate. In some embodiments, pixel circuit 24 is native to display substrate 10, e.g., as a thin-film transistor circuit. Light emitters 28 (e.g., inorganic light-emitting diodes 28 such as blue light-emitting diode 28B that emits blue light, green light-emitting diode 28G that emits green light, and red light-emitting diode 28R that emits red light, collectively LEDs 28), can be disposed on pixel substrate 22.

Light emitters 28 can be electrically connected to pixel circuit 24 with LED wires 29 so that pixel circuit 24 can control light emitters 28 in response to pixel information received on pixel wires 26. Pixel substrate 22 can be non-native to (e.g., a different, separate, and independent substrate from) display substrate 10 or pixel substrate 22 and display substrate 10 can be the same substrate and pixel circuit 24 is disposed on or formed in display substrate 10 and light emitters 28 are disposed directly on display substrate 10 with no intermediate substrate between them. Each light emitter 28 can be assembled on pixel substrate 22 or display substrate 10 by transfer printing, e.g., micro-transfer printing, and can be a micro-LED 28, for example having at least one of (e.g., both) a length and a width no greater than 100 microns, no greater than 50 microns, no greater than 20 microns, or no greater than 10 microns. Such small light emitters 28 leave additional area on display substrate 10 for more or larger wires or circuits, e.g., column-data lines 16, row-select lines 14, pixel connections 26, ground and power wires, or pixel circuits 24 or even other circuits for other functionalities (e.g., touch sensing circuits). LEDS 28 can be horizontal or vertical LEDs 28.

Figure 3:
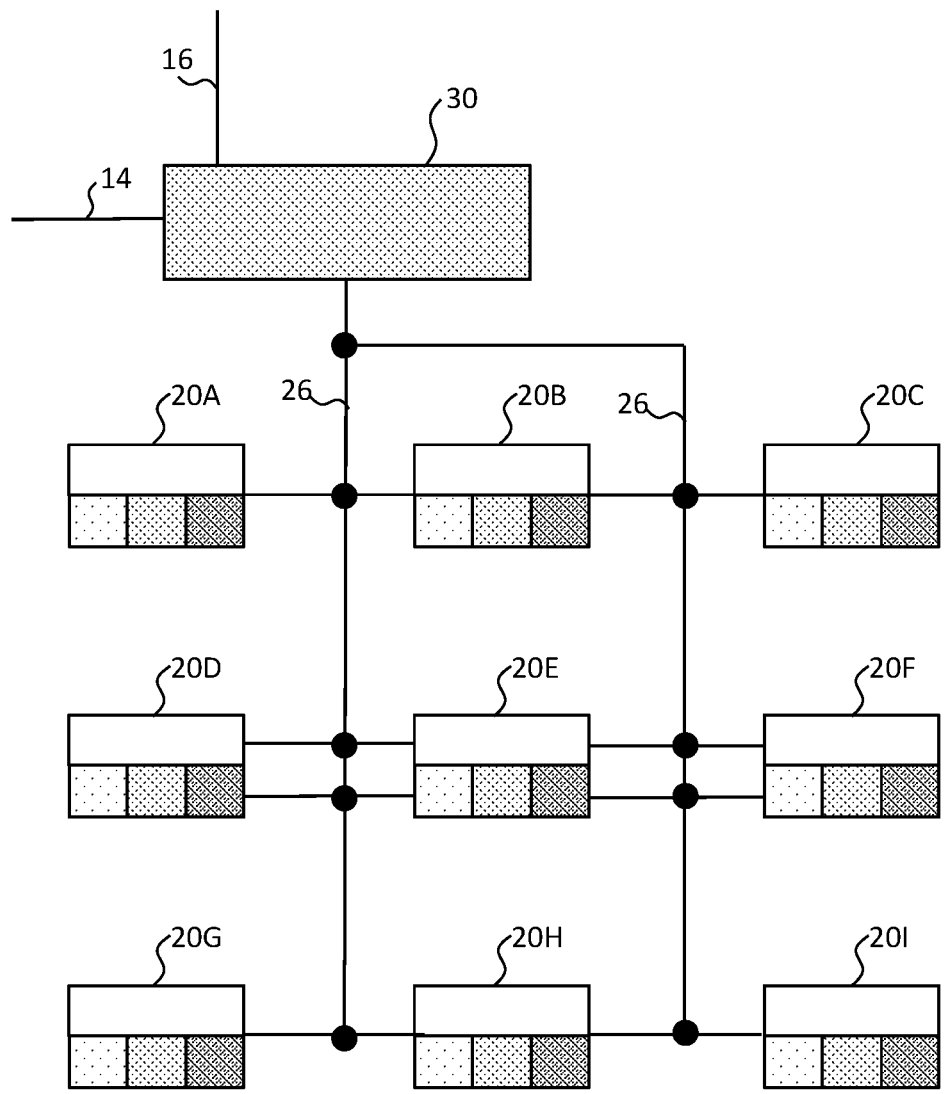
FIG. 3 is a schematic circuit diagram of a pixel group comprising nine pixels connected to a pixel controller according to illustrative embodiments of the present disclosure.

In some embodiments, every pixel 20 has exactly four pixel information inputs 26, as shown in FIG. 2, reducing the number of different types of pixels 20 that are needed in interpolated flat-panel display 99 and thereby reducing manufacturing costs. For example, in some embodiments, a single type of pixel 20 can be used for an array of pixels regardless of how many pixel controllers 30 are connected (e.g., which may be a different number based on pixel 20 location). In some such embodiments, every pixel 20 is connected to four pixel controllers 30. In some embodiments and as shown in FIG. 3, the four pixel inputs 26 of pixel 20E are connected in common, two pixel information inputs 26 of each of pixel 20B, pixel 20D, pixel 20F, and pixel 20H are connected in common to each of two pixel controllers 30 in the x or y directions, and the four pixel inputs 26 of pixel 20A, pixel 20C, pixel 20G, and pixel 20I are individually and separately connected to each of the four nearest pixel controllers 30 in diagonal directions. FIG. 3 thus shows a simplified diagram mapping the electrical connections of pixels 20 to one pixel controller 30 that illustrates how each pixel 20 can have four pixel information inputs 26 but is not necessarily strictly representative of the actual spatial arrangement of the pixels 20. For simplicity, FIG. 3 does not show the additional pixel information inputs 26 to other pixel controllers 30 that are not shown, for example pixels 20D, 20F would have two more pixel information inputs 26 each to its own respective additional pixel controller 30 in a complete diagram. Thus, in some embodiments, pixel information inputs 26 according to FIG. 3 can be used in combination with relative spatial arrangements of pixels 20 and pixel controllers 30 according to FIG. 1.

All of the pixel wires 26 can be connected to a common output of the corresponding pixel controller 30. Thus, according to some embodiments, some interpolated pixels 20 are connected to each of four pixel controllers 30 with a pixel information input 26 and the four pixel controllers 30 can be adjacent in a dimension over display substrate 10 (e.g., an x direction, a y direction, and a diagonal direction with respect to x and y directions). Adjacent pixel controllers 30 are neighboring pixel controllers 30 for which no other pixel controller 30 is between the neighboring pixel controllers 30 in a direction joining the neighboring pixel controllers 30. Likewise, in the same display 99, at least some of interpolated pixels 20 can be connected to each of two pixel controllers 30 with each of two pixel information inputs 26 and at least some of pixels 20 can be connected to one pixel controller 30 with four pixel information inputs 26.

Figure 6:
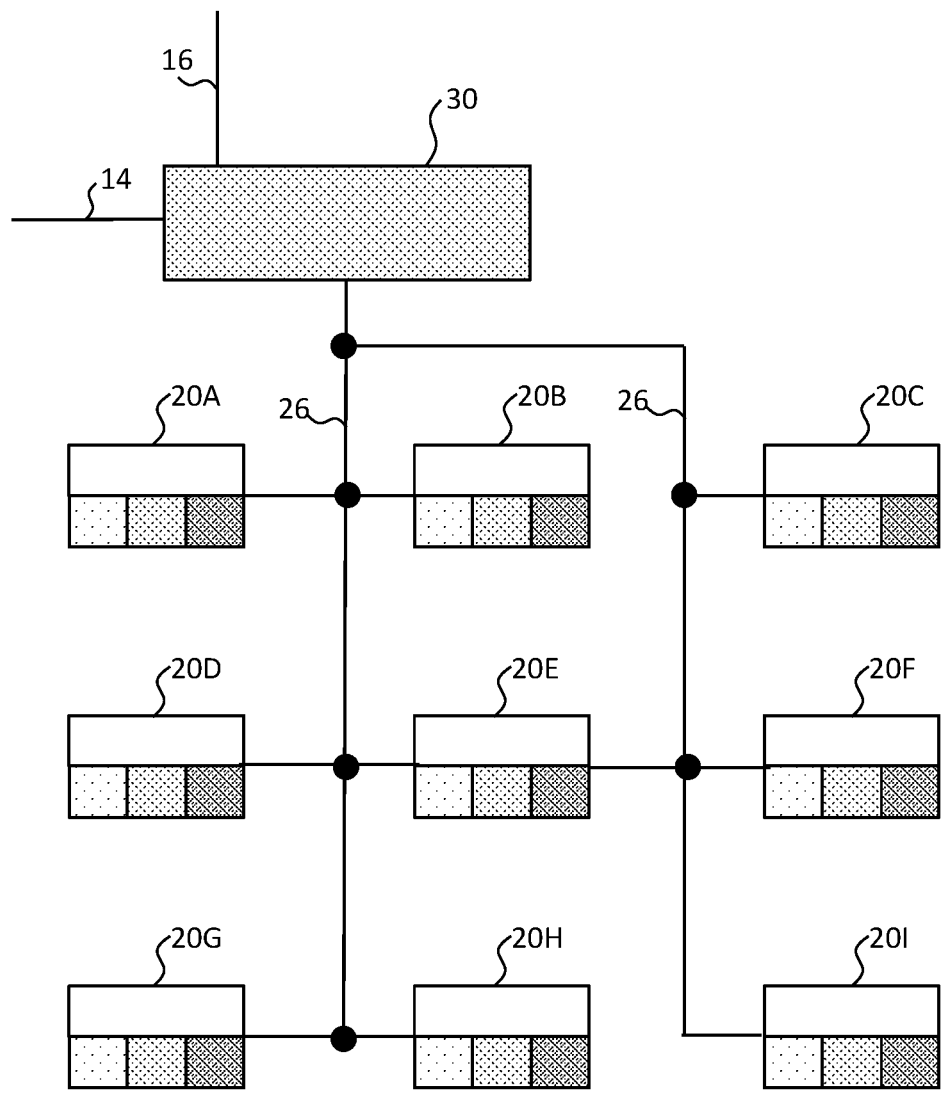
FIG. 6 is a schematic circuit diagram of a pixel group comprising pixels connected to a pixel controller according to illustrative embodiments of the present disclosure.

In embodiments according to FIGS. 1-3, pixels 20 have as many as four pixel inputs 26, and, in some such embodiments, each pixel 20 has exactly four pixel inputs 26. In some embodiments, it is desirable to have fewer pixel inputs 26, for example to reduce the number of connections for some of pixels 20 and improve system yields. For example, and as shown in FIGS. 4-6, pixels 20 can have no more than two pixel information inputs 26, for example each pixel 20 has exactly two pixel inputs 26. FIG. 4 illustrates a pixel controller 30 and pixel 20 arrays. FIG. 5 illustrates a pixel 20 analogous to FIG. 2 but with two pixel connections 26 rather than the four pixel connections 26 of FIG. 2. FIG. 6 illustrates the pixel connections 26 associated with each pixel controller 30 not on an edge of the array of pixel controllers 30. The two pixel inputs 26 of pixel 20E are connected in common and the pixel inputs 26 of pixel 20B, pixel 20D, pixel 20F, and pixel 20H are individually and separately connected to each of the two nearest pixel controller 30 in horizontal (x) or vertical (y) directions. However, pixel 20A, pixel 20C, pixel 20G, and pixel 20I on the diagonal each comprise a double pixel 21 comprising two pixels 20. Each pixel 20 in double pixel 21 is operable to emit light for a single (e.g., interpolated) image pixel (e.g., where the light together forms the image pixel), for example each pixel 20 can be operable to emit the same light as the other pixel 20 at the same time. Each of the two pixels 20 in double pixel 21 are connected with pixel wires 26 to two of the four nearest pixel controllers 30 on the diagonal. Each of the two pixels 20 in double pixel 21 can be programmed to output light at one-half brightness (e.g., luminance), so that the diagonal interpolated pixels 20 are not twice as bright as other (e.g., non-interpolated or non-diagonal) pixels 20 in the array. For example, pixels 20 in double pixel 21 can each include drive circuit 52 that drives light emitter(s) 28 in pixels 20 of double pixel 21 to emit light at one-half brightness as compared to other pixels 20 in display 99 not in a double pixel 21. All of the pixel wires 26 can be connected to a common output of the corresponding pixel controller 30, for example as shown in FIGS. 3 and 6.

Figure 7A:
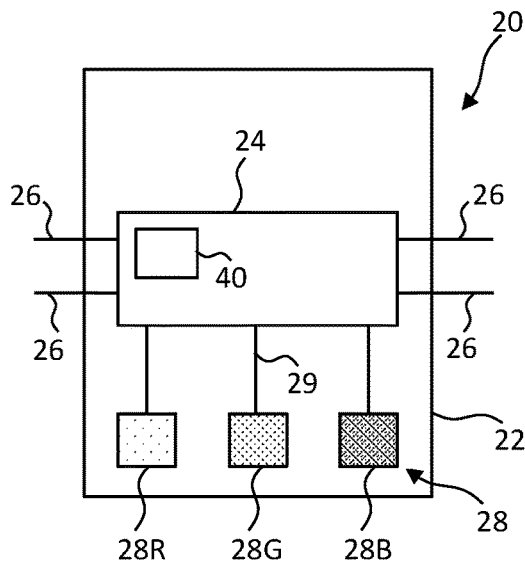
FIGS. 7A-7C are schematic circuit diagrams of programmable pixels according to illustrative embodiments of the present disclosure.

According to some embodiments and as shown in FIGS. 2-3, all pixels 20 in the array of pixels 20 have four pixel connection 26 inputs. Pixels 20 requiring different numbers of pixel connections 26 to pixel controllers 30 are simply connected multiple times, for example as shown in FIG. 3. Calculation circuit 50 can aid in causing pixels 20 having multiple pixel information inputs 26 from the same pixel controller 30 to emit the correct (e.g., intended) light. For example, if calculation circuit 50 averages inputs, then pixel 20E would average four of the same pixel information input 26 to effectively operate as if it only had one pixel information input 26. However, according to some embodiments, pixels 20 can be programmed to only respond to a subset of the four pixel connections 26. For example, a programmable memory 40 (e.g., as shown in FIG. 7A) can be programmed in each pixel 20 controlling to which pixel connections 26 pixel 20 responds (e.g., the number of pixel connections 26 to which pixel 20 responds). Such configurations can reduce the amount of wiring in the array of pixel controllers 30 and pixels 20. For example, pixel 20E can have a programmable memory 40 programmed with a code indicating that only one pixel connection 26 input is used, pixels 20B, 20D, 20F, and 20H, can have a programmable memory 40 programmed with a code indicating that only two pixel connection 26 inputs are used, and pixels 20A, 20C, 20G, and 20I can have a programmable memory 40 programmed with a code indicating that all four pixel connection 26 inputs are used. Rather than using a programmable memory 40, in some embodiments, pixels 20 comprise external or internal signals that are connected to power or ground to provide a code, for example two inputs that can indicate any of the three different states desired (e.g., one pixel information input 26, two pixel information inputs 26, and four pixel information inputs 26). In these embodiments, every pixel 20 can be constructed to be substantially identical (e.g., having the same components that can be operable in the same way and, in some embodiments, structurally identical to within manufacturing tolerances) but programmed (e.g., as firmware, with an EPROM, with laser-cut links or directly in hardware) to provide the appropriate input combinations and luminance control of pixels 20 and light emitters 28 of the pixels 20. Therefore, a display 99 can be wired as if different types of pixels 20 were used (e.g., wherein certain pixel locations have only one pixel information input 26 and others have, for example, two or four pixel information inputs 26) while pixels 20 are substantially identical but programmable to respond appropriately to their different inputs. In this way, a single pixel source wafer can be used for all pixels 20 in a display 99 instead of having to use different pixel source wafers for different pixels 20 based on how they will be interconnected in the display 99 once disposed (e.g., printed).

Figure 7B:
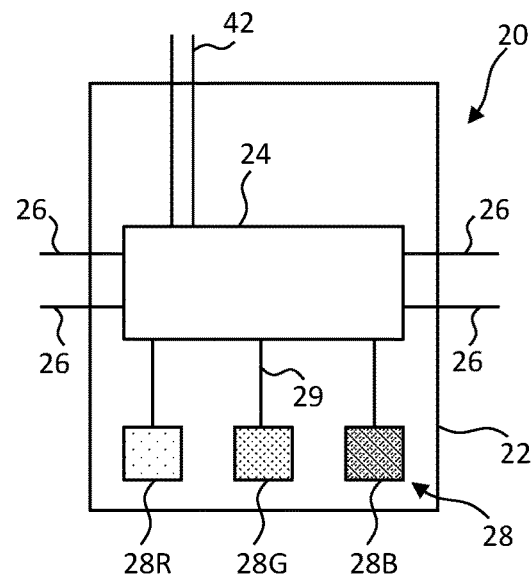
Figure 7C:
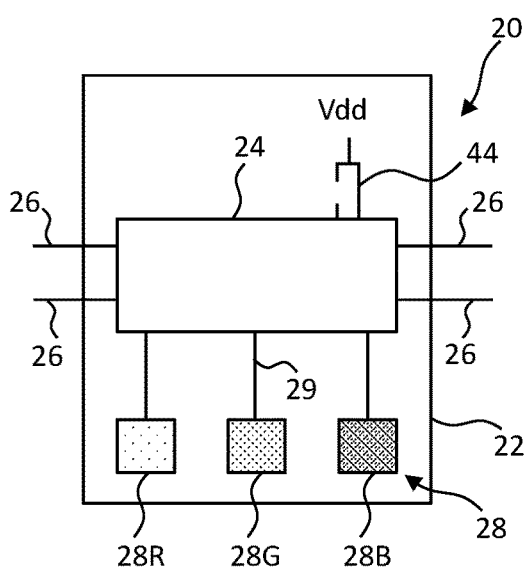

FIG. 7A illustrates a pixel 20 with a programmable memory 40, FIG. 7B illustrates a pixel 20 with externally programmable wires 42 (e.g., connected to power or ground to set a state of the externally programmable wires 42), and FIG. 7C illustrates a pixel 20 with internally programmable wires 44 (e.g., connected to power and cuttable with a laser and pulled to ground (or power) through a resistor to set a state of the internally programmable wires 44). Any one or combination of such embodiments can be used to program pixel 20. Since pixels 20 can be constructed as unpackaged dies, photolithographic tools can be used to program or otherwise modify circuits, signals, or connections. Thus, according to some embodiments, at least some pixels 20 comprise a programmable memory 40, internally programmable wires 44, or externally programmable wires 42 indicating the number of pixel information input 26 connections for pixel 20. Programmable memory 40 can used in combination with one or more of pixel memory 54, drive circuit 52, and calculation circuit 50 in a pixel circuit 24 of pixels 20, for example in a pixel circuit 24 that is a single integrated circuit or is a plurality of discrete, electrically connected circuits (e.g., that are non-native to a pixel substrate 22). Internally programmable wires 44 or externally programmable wires 42 can be used in a combination with a pixel circuit 24.

As shown in FIGS. 1, 3, 4, and 6, interpolated pixels 20 are connected to adjacent pixel controllers 30 and some are interpolated in two dimensions, for example x and y (horizontal and vertical), so that there are four times as many pixels 20 as pixel controllers 30. According to some embodiments, pixels 20 are only interpolated in one dimension (e.g., in the x or y dimension). In some such embodiments, only interpolated pixels 20 on the sides of adjacent pixel controllers 30 corresponding to the interpolated dimension are present, so that there are two times as many pixels 20 as pixel controllers 30. For example, only pixels 20D, 20E, and 20F are connected with pixel connections 26 to adjacent pixel controllers 30.

According to some embodiments of the present disclosure and as illustrated in FIGS. 2 and 5, each interpolated pixel 20 can comprise a calculation circuit 50 operable to calculate a light-output value in response to pixel information signals (e.g., as part of pixel circuit 24), a light emitter 28, and a drive circuit 52 operable to drive light emitter 28 in response to the calculated light-output value. For example, calculation circuit 50 can calculate an average (e.g., a weighted average), a minimum, or a maximum, of the received pixel information from different pixel controllers 30, thereby combining the received pixel information. A weighted average can be weighted based on a respective location of the respective more than one of the pixels controllers. In some embodiments, calculation circuit 50 comprises or is in communication with a pixel memory 54 operable to store a light-output value.

Figure 8:
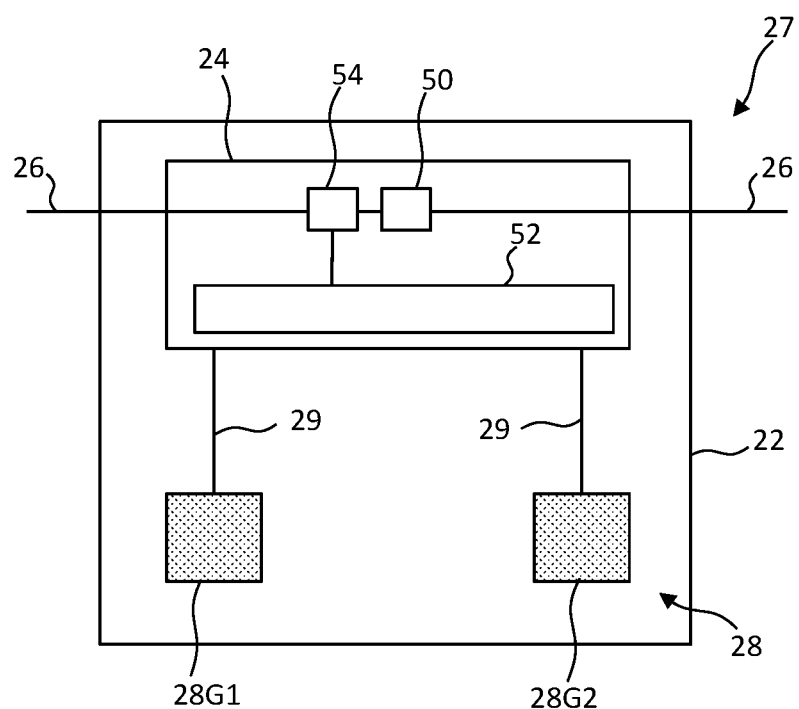
FIG. 8 is a schematic circuit diagram of a two-input pixel with only green light emitters according to illustrative embodiments of the present disclosure.

According to some embodiments of the present disclosure and as illustrated in FIG. 8, green interpolated pixels 27 are interpolated pixels 20 that comprise only green light emitters 28 (e.g., 28G1, 28G2) that emit green light in response to pixel information received from the at least two pixel controllers 30. The human visual system is more sensitive to green light and has a greater response to green light at a corresponding greater spatial frequency. Thus, interpolated flat-panel display 99 will appear sharper and have an apparently greater resolution if interpolated pixels 20 are green interpolated pixels 27 that have two green light emitters 28 (rather than a red, green, and blue light emitter 28R, 28G, 28B of a full-color pixel 20). Each green light emitter 28G in a green interpolated pixel 27 can emit green light corresponding to only one pixel controller 30 and at half brightness. For example, green light emitter 28G1 in green interpolated pixel 27 can emit light corresponding to a pixel controller 30 on one side of pixel controller 30 at half brightness and green light emitter 28G2 in green interpolated pixel 27 can emit light corresponding to a pixel controller 30 on an opposite side of pixel controller 30 at half brightness. Green interpolated pixel 27 is simpler than a full-color interpolated pixel 20 because there is no need to combine (e.g., average) light from the at least two pixel controllers 30. According to embodiments, the two green light emitters 28G1, 28G2 in green interpolated pixel 27 are disposed spatially close to each other so that an observer cannot separately distinguish the light emitted from the two green light emitters 28G1, 28G2 and the human visual system will therefore respond to the combined green light emitted from the two green light emitters 28G1, 28G2 in green interpolated pixel 27. Thus, the human visual system does the task of combining the green light from two different light emitters 28 in a common pixel 20. This arrangement reduces the cost of interpolated pixels 20 by reducing the size and cost of pixel circuits 24.

Pixel controllers 30 can be integrated circuits, for example CMOS circuits formed in a silicon substrate using photolithographic methods and materials. Pixel controllers 30 can be assembled on display substrate 10, for example by transfer printing, and can incorporate a broken (e.g., fractured) or separated tether. Similarly, pixels 20 can be modules comprising multiple components (e.g., pixel circuit 24 and LEDs 28) disposed on pixel substrate 22, for example by micro-transfer printing. Pixel circuit 24 can be an integrated circuit, for example a mixed signal circuit comprising analog and digital CMOS circuits formed in a silicon substrate using photolithographic methods and materials. LEDs 28 can be assembled on display substrate 10, for example by transfer printing, and can incorporate a broken (e.g., fractured) or separated tether. LEDs 28 can be compound semiconductor devices.

Display substrate 10 (or pixel substrate 22) can be any useful substrate on which pixels 20 and column-data lines 16 can be suitably disposed, for example display substrate 10 can include polymer, plastic, resin, polyimide, PEN, PET, metal, metal foil, glass, fiberglass, a semiconductor, ceramic, quartz, sapphire, or other substrates found in the display or integrated circuit industries. In some embodiments of the present disclosure, LEDs 28 emit light through display substrate 10 and display substrate 10 can have a transparency greater than or equal to 50%, 80%, 90%, or 95% for visible light or light emitted by light emitter 28. In some embodiments, LEDs 28 emit light in a direction opposite display substrate 10.

Display substrate 10 can be flexible or rigid and can be substantially flat. Column-data lines 16 and row-select lines 14 can be wires (e.g., photolithographically defined electrical conductors such as metal lines) disposed on display substrate 10 that conduct electrical signals from a display controller (e.g., from a column controller to column-data lines 16 and from a row controller to row-select lines 14). Display substrate 10 usefully has two opposing smooth sides suitable for material deposition, photolithographic processing, or micro-transfer printing of pixel controllers 30, pixels 20, or micro-LEDs 28. Display substrate 10 can have a size of a conventional display, for example a rectangle with a diagonal of a few centimeters to one or more meters. Display substrate 10 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, display substrate 10 can include layers formed on an underlying structure or substrate, for example a rigid or flexible glass or plastic substrate.

The pixel array can be a completely regular array of pixels 20 (as shown in FIGS. 1 and 4) or can have rows or columns of pixels 20 that are offset from each other, so that rows or columns of pixels 20 are not disposed in a straight line and can, for example, form a zigzag line (not shown in the Figures). In some embodiments, pixels 20 can be arranged irregularly or randomly in the pixel array.

Pixels 20 and LEDs 28 can be made in multiple integrated circuits that are non-native to display substrate 10, for example having separate, independent, and distinct substrates (e.g., pixel substrate 22) from display substrate 10. The multiple integrated circuits can be micro-elements micro-transfer printed onto display substrate 10 or onto pixel substrate 22 with pixel substrate 22 then micro-assembled (e.g., micro-transfer printed) onto display substrate 10, for example from a pixel source wafer. The multiple integrated circuits can be small, unpackaged integrated circuits such as unpackaged dies interconnected with wires connected to contact pads on the integrated circuits, for example formed using photolithographic methods and materials. In some embodiments, the integrated circuits are made in or on a semiconductor wafer and have a semiconductor substrate. In some embodiments, pixel substrate 22 is a semiconductor substrate and one or more of pixel circuit 24, programmable memory 40, calculation circuit 50, drive circuit 52, and pixel memory 54 are formed in or on and are native to pixel substrate 22. Semiconductor materials (for example doped or undoped silicon, GaAs, or GaN) and processes for making small integrated circuits are well known in the integrated circuit arts. Likewise, backplane substrates and means for interconnecting integrated circuit elements on the backplane are well known in the display and printed circuit board arts.

In some methods of the present disclosure, the integrated circuits are disposed on the display substrate 10 by micro transfer printing. In some methods, the integrated circuits (or portions thereof) or LEDs 28 are disposed on pixel substrate 22 to form a heterogeneous pixel module and the pixel modules are disposed on display substrate 10 using compound micro-assembly structures and methods, for example as described in U.S. patent application Ser. No. 14/822,868 filed Aug. 10, 2015, entitled Compound Micro-Assembly Strategies and Devices. However, since pixel modules can be larger than integrated circuits, in some method of the present disclosure, the pixel modules are disposed on display substrate 10 using pick-and-place methods found in the printed-circuit board industry, for example using vacuum grippers. The pixel modules can be interconnected with display substrate 10 using photolithographic methods and materials or printed circuit board methods and materials.

In certain useful embodiments, display substrate 10 includes material, for example glass or plastic, different from a material in an integrated-circuit substrate, which can be or include, for example, a semiconductor material such as silicon or GaN or GaAs. LEDs 28 can be formed separately on separate semiconductor substrates, assembled onto the semiconductor substrates (e.g., pixel substrate 22) and then the assembled unit is located on the surface of display substrate 10. This arrangement has the advantage that the integrated circuits or pixel modules can be separately tested on pixel substrate 22 and the pixel modules accepted, repaired, or discarded before the pixel module is located on display substrate 10, thus improving yields and reducing costs.

In embodiments of the present disclosure, providing interpolated flat-panel display 99, display substrate 10, or pixels 20 can include forming conductive wires (e.g., row-select lines 14 and column-data lines 16) on display substrate 10 or pixel substrate 22 by using photolithographic and display substrate processing techniques, for example photolithographic processes employing metal or metal oxide deposition using one or more of evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. The electrical interconnections, or wires, can be fine interconnections, for example having a width of less than fifty microns, less than twenty microns, less than ten microns, less than five microns, less than two microns, or less than one micron. Such fine interconnections are useful for interconnecting micro-integrated circuits, for example as bare dies with contact pads and used with the pixel substrates 22. Alternatively, wires can include one or more crude lithography interconnections having a width from 2 µm to 2 mm, wherein each crude lithography interconnection electrically connects the pixel modules to display substrate 10. According to various embodiments, interpolated flat-panel display 99 can include a variety of designs having a variety of resolutions, light emitter 28 sizes, and displays having a range of display substrate 10 areas.

In some embodiments, the red, green, and blue micro-LEDs 28R, 28G, 28B (e.g., micro-LEDs 28) are micro transfer printed to the pixel substrates 22 or the display substrate 10 in one or more transfers and can comprise broken (e.g., fractured) or separated tethers as a consequence of micro-transfer printing. For a discussion of micro-transfer printing techniques see U.S. Pat. Nos. 8,722,458, 7,622,367 and 8,506,867, each of which is hereby incorporated by reference in their entirety. The transferred light emitters 28 are then interconnected, for example with conductive wires using photolithographic methods and materials and optionally including connection pads and other electrical connection structures (e.g., connection posts), to enable a display controller (not shown in the Figures) to electrically interact with the light emitters 28 to emit light according to the present disclosure.

By employing a multi-step transfer or assembly process using pixel substrate 22, increased yields are achieved and thus reduced costs for interpolated flat-panel displays 99 of the present disclosure. Additional details useful in understanding and performing aspects of the present invention are described in U.S. patent application Ser. No. 14/743,981, filed Jun. 18, 2015, entitled Micro Assembled Micro LED Displays and Lighting Elements.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

As is also understood by those skilled in the art, the terms "column" and "row", "horizontal" and "vertical", and "x" and "y" are arbitrary designations that can be interchanged so long as any relative reference is accordingly changed.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously.

Having described certain embodiments of displays and associated methods, it will now become apparent to one of skill in the art that other embodiments incorporating the concepts of the disclosure may be used. The disclosure has been described in detail with particular reference to certain embodiments thereof, but it will be understood that variations and modifications can be effected within the spirit and scope of the claimed invention.

PARTS LIST x x direction/x dimension
y y direction/y dimension
10 display substrate
14 row-select line
16 column-data line
20 pixel
20A, 20B, 20C, 20D, 20E, 20F, 20G, 20H, 20I pixel
21 double pixel
22 pixel substrate
24 pixel circuit
26 pixel wire/pixel connection/pixel information input/pixel input
27 green interpolated pixel
28 light emitter/light-emitting diode (LED)/micro-LED
28R red light emitter/red light-emitting diode
28G green light emitter/green light-emitting diode
28B blue light emitter/blue light-emitting diode
28G1 green light emitter/green light-emitting diode
28G2 green light emitter/green light-emitting diode
29 LED wire
30 pixel controller
40 programmable memory
42 externally programmable wire
44 internally programmable wire
50 calculation circuit
52 drive circuit
54 pixel memory
99 interpolated flat-panel display

What is claimed:

1. A flat-panel active-matrix display, comprising:
an array of pixel controllers; and
an array of substantially identical pixels,
wherein different ones of the pixels in the array of pixels are electrically connected to different numbers of the pixel controllers.

2. The display of claim 1, wherein each of the pixels in the array of pixels comprises a programmable memory that is programmable to store a code that indicates the number of the pixel controller(s) to which the pixel is electrically connected by respective pixel information input(s).

3. The display of claim 1, wherein each of the pixels in the array of pixels comprises one or more programmable wires that are programmable to store a code that indicates the number of the pixel controller(s) to which the pixel is electrically connected by respective pixel information input(s).

4. The display of claim 1, wherein some of the pixels, and less than all of the pixels, are electrically connected to at least two of the pixel controllers.

5. The display of claim 4, wherein none of the pixels are electrically connected to more than two of the pixel controllers.

6. The display of claim 4, wherein the some of the pixels comprise pixels electrically connected to exactly two of the pixels controllers and pixels electrically connected to exactly four of the pixel controllers.

7. The display of claim 1, wherein the number of the pixels is larger than the number of the pixel controllers.

8. The display of claim 1, wherein each of the pixels is constructed to be able to receive pixel information from a number of pixel information inputs equal to a maximum number of the pixel controllers to which any of the pixels is electrically connected.

9. A pixel comprising:
a pixel substrate;
one or more light emitters; and
a pixel circuit comprising a drive circuit and a calculation circuit,
wherein (i) the pixel circuit is disposed on or in the pixel substrate, (ii) the calculation circuit is operable to send a light-output value to the drive circuit based on pixel information from two or more pixel information inputs upon receiving the pixel information, and (iii) the drive circuit causes the one or more light emitters to emit light in response to receiving the light-output value.

10. The pixel of claim 9, wherein the pixel circuit further comprises a programmable memory disposed on or in the pixel substrate, wherein the programmable memory is operable to store a code that indicates to the calculation circuit a number of pixel information input(s) usable to generate the light-output value.

11. The pixel of claim 9, wherein the pixel substrate is a semiconductor substrate and the calculation circuit and the drive circuit are formed in the semiconductor substrate.

12. The pixel of claim 9, wherein the drive circuit and the calculation circuit are non-native to the pixel substrate and are electrically connected on the pixel substrate.

13. A pixel comprising:
a pixel substrate;
one or more light emitters; and
a pixel circuit comprising a drive circuit and a programmable memory,
wherein the pixel circuit is disposed on or in the pixel substrate and the programmable memory is operable to store a code that indicates to the pixel circuit a number of pixel information input(s) usable to control the drive circuit to cause the one or more light emitters to emit light.

14. The pixel of claim 13, wherein the pixel circuit further comprises a calculation circuit operable to receive pixel information from the pixel information input(s) and generate a light-output value that is sent to the drive circuit to cause the light to be emitted.

15. The pixel of claim 13, wherein the pixel substrate is a semiconductor substrate and the calculation circuit and the drive circuit are formed in the semiconductor substrate.

16. The pixel circuit of claim 13, wherein the drive circuit and the calculation circuit are non-native to the pixel substrate and are electrically connected on the pixel substrate.

* * * * *